(12) United States Patent
Otsuka et al.

(10) Patent No.: US 8,503,248 B2
(45) Date of Patent: Aug. 6, 2013

(54) NONVOLATILE SEMICONDUCTOR MEMORY DEVICE

(75) Inventors: Takahiro Otsuka, Kanagawa-ken (JP); Toshiaki Edahiro, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 292 days.

(21) Appl. No.: 13/070,092

(22) Filed: Mar. 23, 2011

(65) Prior Publication Data
US 2011/0235416 A1 Sep. 29, 2011

(30) Foreign Application Priority Data
Mar. 23, 2010 (JP) ................................. 2010-066949

(51) Int. Cl.
*G11C 16/06* (2006.01)
(52) U.S. Cl.
USPC ............. 365/185.25; 365/185.11; 365/185.17
(58) Field of Classification Search
USPC ........................... 365/185.11, 185.17, 185.25
See application file for complete search history.

(56) References Cited

U.S. PATENT DOCUMENTS

| | | | |
|---|---|---|---|
| 6,058,044 A | 5/2000 | Sugiura et al. | |
| 6,072,721 A | 6/2000 | Arase | |
| 6,771,536 B2 | 8/2004 | Li et al. | |
| 6,914,816 B2 | 7/2005 | Sugiura et al. | |
| 6,925,005 B2 | 8/2005 | Kawamura et al. | |
| 7,242,620 B2 | 7/2007 | Nagashima | |
| 7,259,990 B2 | 8/2007 | Maejima et al. | |
| 7,286,400 B2 | 10/2007 | Kojima et al. | |
| 7,286,403 B2 | 10/2007 | Maejima | |
| 7,324,378 B2 | 1/2008 | Lee | |
| 7,345,913 B2 | 3/2008 | Isobe | |
| 7,623,383 B2 | 11/2009 | Park et al. | |
| 2002/0114188 A1 | 8/2002 | Lee | |
| 2008/0186766 A1* | 8/2008 | Ogura et al. | ............. 365/185.05 |
| 2010/0110789 A1* | 5/2010 | Chandrasekhar | ........ 365/185.03 |

FOREIGN PATENT DOCUMENTS

| | | |
|---|---|---|
| EP | 1 826 768 A2 | 8/2007 |
| JP | 10-320988 | 12/1998 |
| JP | 11-176960 | 7/1999 |
| JP | 2002-251896 | 9/2002 |
| JP | 2004-14043 | 1/2004 |
| JP | 2004-30866 | 1/2004 |
| JP | 2004-87002 | 3/2004 |

(Continued)

OTHER PUBLICATIONS

Office Action issued May 29, 2012 in Japanese Application No. 2010-066949 (With English Translation).

*Primary Examiner* — Hoai V Ho
(74) *Attorney, Agent, or Firm* — Oblon, Spivak, McClelland, Maier & Neustadt, L.L.P.

(57) ABSTRACT

A nonvolatile semiconductor memory device for raising operating speed is provided. The nonvolatile semiconductor memory device includes plural bit lines extending in a first direction, and a memory cell that includes plural blocks each having plural NAND strings each of which includes a group of memory cells connected in series with one another and selecting transistors connected to the respective ends of the memory cell group. One ends of current paths in ones of the selecting transistors are connected to the bit lines, while one ends of current paths in the other selecting transistors are connected to a source line. The nonvolatile semiconductor memory device further includes a memory cell array and a voltage control circuit that is disposed in the memory cell array in a manner of bisecting the memory cell array and that charges or discharges the bit lines.

12 Claims, 10 Drawing Sheets

FOREIGN PATENT DOCUMENTS

| | | |
|---|---|---|
| JP | 2004-164775 | 6/2004 |
| JP | 2006-48776 | 2/2006 |
| JP | 2006-79695 | 3/2006 |
| JP | 2006-134558 | 5/2006 |
| JP | 2006-146989 | 6/2006 |
| JP | 2006-209949 | 8/2006 |
| JP | 2006-302960 | 11/2006 |
| JP | 2006-338796 | 12/2006 |
| JP | 2007-12151 | 1/2007 |
| JP | 2007-207409 | 8/2007 |
| JP | 2007-221136 | 8/2007 |

* cited by examiner

NONVOLATILE SEMICONDUCTOR MEMORY DEVICE

CROSS-REFERENCE TO RELATED APPLICATION

This application is based upon and claims the benefit of priority from the prior Japanese Patent Application No. P2010-66949, filed on Mar. 23, 2010. The entire contents of which are incorporated herein by reference.

BACKGROUND OF THE INVENTION

1. Field of the Invention

The present invention relates to a nonvolatile semiconductor memory device including electrically rewritable memory cells.

2. Description of the Related Art

As one of electrically rewritable nonvolatile semiconductor memories (electrically erasable programmable read-only memories (EEPROMs)), a NAND type flash memory is known. Since the NAND type flash memory is nonvolatile and can realize a capacity enlargement and dense integration, the usage thereof is expanding.

Along with the trend of the NAND type flash memory toward a capacity enlargement, the number of memory cells connected to bit lines increases. Then, it is necessary to extend the bit-line length, and leads to an increase in each of the capacity of the bit lines and the resistance thereof. In addition, since space between bit lines gets narrowed in accordance with reduction in a chip size, the capacitive coupling between bit lines is intensified.

The NAND type flash memory controls the bit lines upon data writing as, for example, described below. Unselected bit lines to which non-writing memory cells are connected are charged to have a power supply voltage VDD (for example, 2 V), while selected bit lines to which memory cells to be written are connected are discharged to have a ground voltage VSS (0 V).

Under such control, when the bit-line length is large, since the bit lines have a high resistance and a high capacity, it takes much time to charge or discharge the bit lines. Therefore, the operating speed of the NAND type flash memory decreases.

As a related art, the technology for speeding up read and verification operations by dividing the bit lines into groups has been disclosed.

BRIEF SUMMARY OF THE INVENTION

A nonvolatile semiconductor memory device in accordance with one aspect of the present invention includes plural bit lines extending in a first direction, and a memory cell array that includes plural blocks each including plural NAND strings each of which has a group of memory cells connected in series with one another, and first and second selecting transistors connected to the respective edges of the memory-cell group. One ends of current paths in the first selecting transistors are connected to the bit lines, while one ends of current paths in the second selecting transistors are connected to a source line. The nonvolatile semiconductor memory device further includes a voltage control circuit that is disposed in the memory cell array in a manner of bisecting the memory cell array and that charges or discharges the bit lines.

According to the present invention, there is provided a nonvolatile semiconductor memory device whose operating speed can be raised.

DETAILED DESCRIPTION OF THE INVENTION

Figure 1:
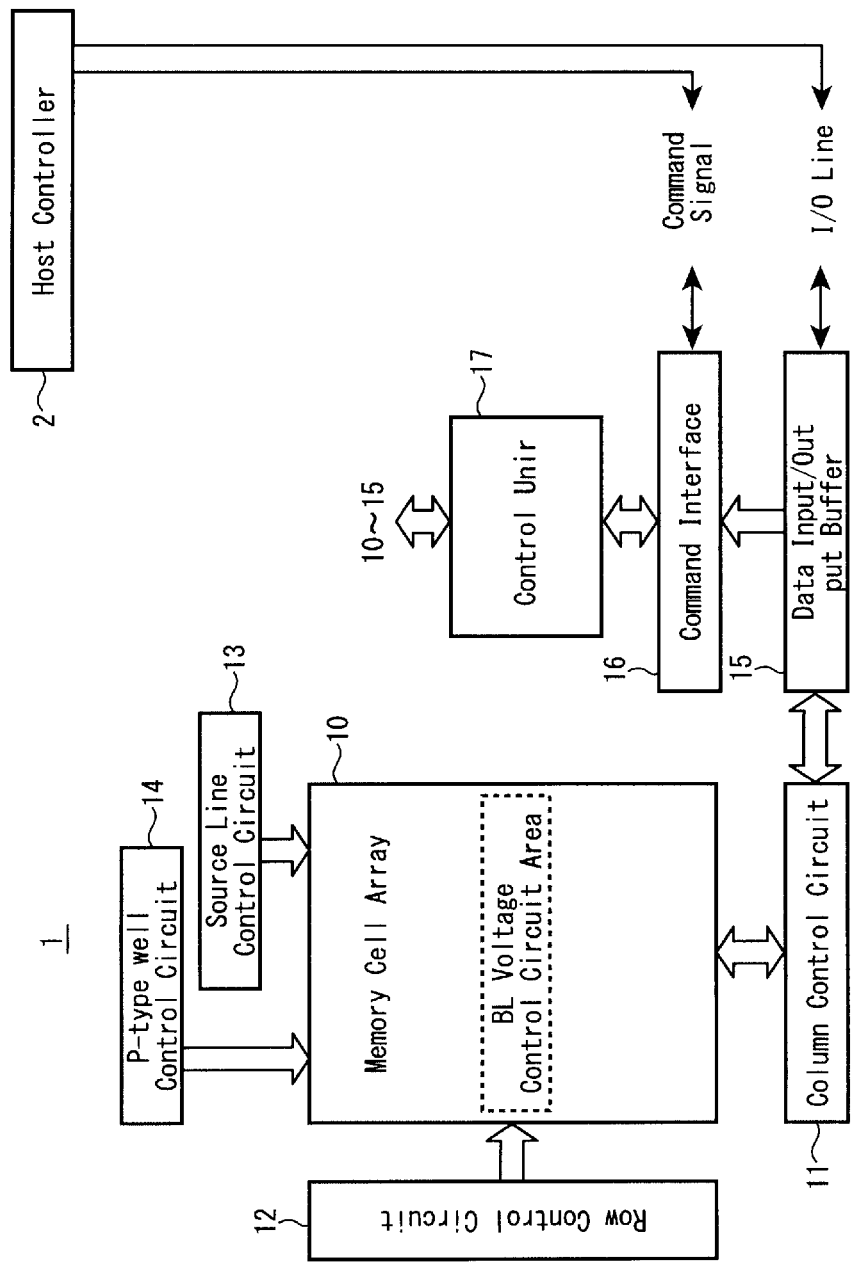
FIG. 1 is a block diagram showing the configuration of a NAND type flash memory 1.

Referring to the drawings, embodiments of the present invention will be described below. The embodiments to be presented below are examples of a device and method for embodying the technological idea of the present invention. The technological idea of the present invention is not specified by the shapes of components, the structures thereof, and the arrangement thereof. In a description to be made below, the same reference numerals will be assigned to elements sharing the same capabilities and structures. An iterative description will be made only when it is required.

(First Embodiment)

FIG. 1 is a block diagram showing the configuration of a NAND type flash memory 1 serving as a nonvolatile semiconductor memory device in accordance with a first embodiment of the invention. A memory cell array 10 has electrically rewritable flash memory cells arranged in the form of a matrix. In the memory cell array 10, there are plural bit lines BL extending in a column direction, plural word lines WL extending in a row direction, and source lines CELSRC extending in the row direction.

A column control circuit 11 is connected to the bit lines BL. The column control circuit 11 selects any of the bit lines BL, controls the voltage of the bit lines BL, and deletes data from memory cells, writes data in the memory cells, or read data from the memory cells. The column control circuit 11 includes column decoders and sense amplifiers SA.

A row control circuit 12 is connected to the word lines WL. The row control circuit 12 selects any of the word lines WL, and applies a voltage, which is necessary to delete, write, or read data, to any of the word lines WL. The row control circuit 12 includes row decoders and word line drivers.

A source line control circuit 13 controls a voltage of the source lines CELSRC arranged in the memory cell array 10. The source line control circuit 13 controls voltages of source lines CELSRC1 and CELSRC2 arranged in the bit-line voltage control circuit 20 described below. A p-type well control circuit 14 controls a voltage in a p-type well in which the memory cell array 10 is formed.

A data input/output buffer 15 is connected to an external host controller 2 via an input/output line, and receives writing data, outputs read data, or receives an address or a command.

The data input/output buffer 15 transmits writing data, which is received externally, to the column control circuit 11, and outputs read data, which is read by the column control circuit 11, to outside. In addition, the data input/output buffer 15 transmits an address, which is received externally, to the column control circuit 11 or the row control circuit 12 via a control unit 17 to select memory cells. Further, the data input/output buffer 15 transmits a command from the host controller 2 to a command interface 16.

The command interface 16 receives a control signal from the host controller 2, and determines whether data inputted to the data input/output buffer 15 is writing data, a command, or an address. If the data is a command, the command interface 16 receives the command and transmits thereof as a command signal to the control unit 17.

The control unit 17 manages the entire NAND type flash memory 1. On receipt of a command from the host controller 2, the control unit 17 manages reading, writing, deletion, and inputting or outputting of data. The control unit 17 transmits a control signal required to any of the operations, to the respective circuits.

Figure 2:
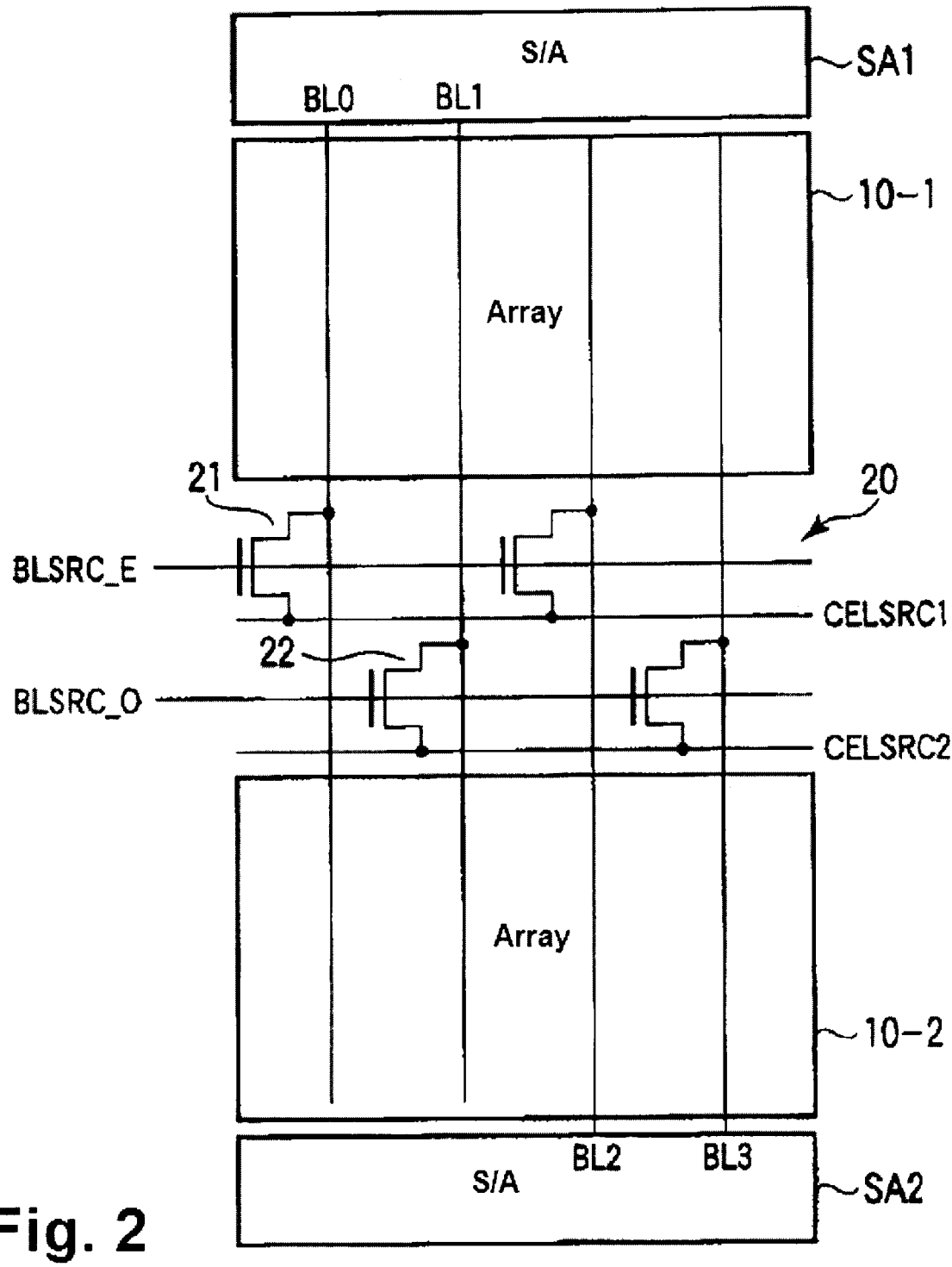
FIG. 2 is a circuit diagram showing the configuration of a bit-line voltage control circuit 20.

The NAND type flash memory 1 includes the bit-line voltage control circuit 20 in the memory cell array 10. The bit-line voltage control circuit 20 charges or discharges the bit lines BL, and brings the bit lines BL to a predetermined voltage level. FIG. 2 is a circuit diagram showing the configuration of the bit-line voltage control circuit 20.

The bit-line voltage control circuit 20 is disposed in the memory cell array 10 in a manner of bisecting the memory cell array 10. In other words, the bit-line voltage control circuit 20 is interposed between a first memory cell array 10-1 and a second memory cell array 10-2. The first memory cell array 10-1 and second memory cell array 10-2 are connected to the common bit lines. Sense amplifiers SA1 and SA2 included in the column control circuit 11 are arranged to sandwich the memory cell array 10. The bit lines BL coupled in twos are alternately connected to the sense amplifiers SA1 and sense amplifiers SA2. In FIG. 2, for brevity's sake, only four bit lines BL0 to BL3 are shown. However, actually, a larger number of bit lines is disposed in the memory cell array 10.

The bit-line voltage control circuit 20 includes the same number of n-channel metal oxide semiconductor field effect transistors (MOSFETs) 21 as the number of odd-numbered bit lines, and the same number of n-channel MOSFETs 22 as the number of even-numbered bit lines. The n-channel MOSFETs (NMOSFETs) 21 and 22 are of an enhancement type. Since a high voltage of about 20 V is applied to the NMOSFETS 21 and 22, MOSFETs with high voltage resistance are used as the NMOSFETs 21 and 22. For example, the NMOSFETs 21 and 22 have the same voltage resistance as selecting transistors included in each NAND string do.

The drain of each of the NMOSFETs 21 is connected to one even-numbered bit line, the source thereof is connected to a source line CELSRC1, and the gate thereof is connected to a selecting line BLSRC_E. The NMOSFETs 21 is turned on or off by the control unit 17 over the selecting line BLSRC_E. The voltage of the source line CELSRC1 is controlled by the source line control circuit 13.

The drain of each of the NMOSFETs 22 is connected to one odd-numbered bit line, the source thereof is connected to a source line CELSRC2, and the gate thereof is connected to a selecting line BLSRC_O. The NMOSFETs 22 is turned on or off by the control unit 17 via the selecting line BLSRC_O. The voltage of the source line CELSRC2 is controlled by the source line control circuit 13.

The bit-line voltage control circuit 20 is preferably connected in the center of the bit lines BL. In other words, the bit-line voltage control circuit 20 is disposed in the center in a bit-line direction of the memory cell array 10. However, the position of the bit-line voltage control circuit 20 is not limited to this one. The bit-line voltage control circuit 20 may merely be disposed in the memory cell array in a manner of bisecting the memory cell array 10.

Figure 3:
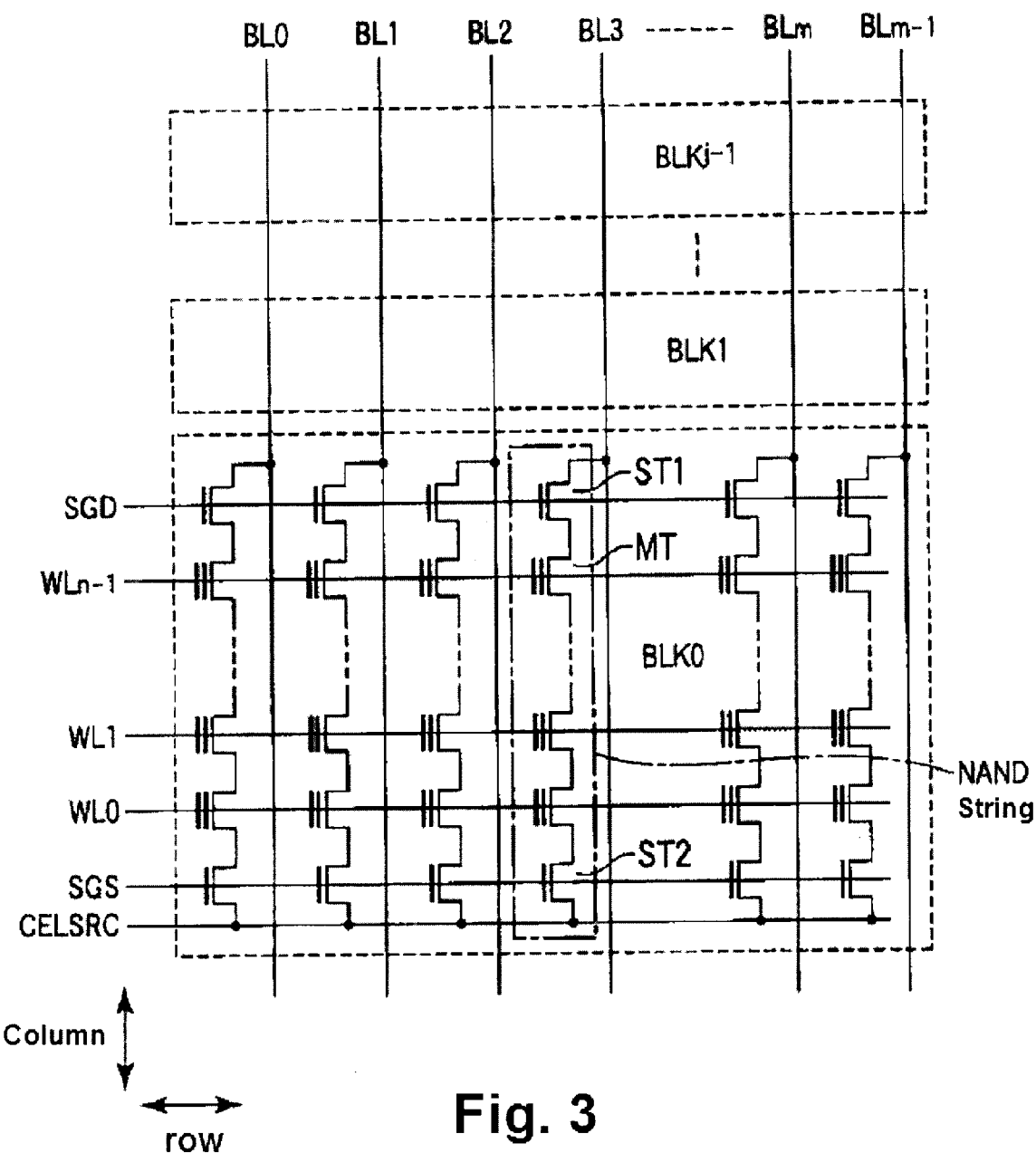
FIG. 3 is a circuit diagram showing the configuration of a memory cell array 10-1.

FIG. 3 is a circuit diagram showing the configuration of the memory cell array 10-1. The configuration of the memory cell array 10-2 is identical to that shown in FIG. 3. The memory cell array 10-1 includes j blocks BLK0 to BLKj−1 (where j denotes an integer equal to or larger than 1). The block BLK is a minimum unit of data deletion.

Each of the blocks BLK includes m NAND strings (where m denotes an integer equal to or larger than 1) arranged orderly in a row direction. Selecting transistors ST1 included in the NAND strings have the drains thereof connected to the bit lines BL and have the gates thereof connected in common to a selecting gate line SGD. Selecting transistors ST2 included in the NAND strings have the sources thereof connected in common to the source line CELSRC, and have the gates thereof connected in common to a selecting gate line SGS.

Each memory cell transistor (which may be called a memory cell) MT is constructed with a MOSFET that has a stacked gate structure formed on a p-type well. The stacked gate structure includes a charge accumulation layer (floating gate electrode) formed on the p-type well with a gate insulating film therebetween, and a control gate electrode formed on the floating gate electrode with an inter-gate insulating film therebetween. The memory cell transistor MT has the threshold voltage thereof varied depending on the number of electrons accumulated in the floating gate electrode, and stores data according to a difference in the threshold voltage. The memory cell transistor MT may be constructed to store 1-bit data (binary data) or store data of two or more bits (multi-level data).

The memory cell transistor MT is not limited to a floating gate structure having a floating gate electrode, but may have a structure, in which electrons can be trapped onto an interface of a nitride film serving as the charge accumulation layer so that the threshold voltage thereof can be adjusted, such as, a metal oxide nitride oxide silicon (NOMOS) structure. Even the memory cell transistor MT having the MONOS structure may be constructed to store binary data or multi-level data.

In each NAND string, n memory cell transistors MT (where n denotes an integer equal to or larger than 1) are interposed between the source of the selecting transistor ST1 and the drain of the selecting transistor ST2 so that the current paths therein are connected in series with one another. Namely, the n memory cell transistors MT are connected in series with one another in a column direction so that adjoining ones thereof share the same diffuse region (source region or drain region).

In each NAND string, the control gate electrodes of the memory cell transistors MT, which begin with the memory cell transistor MT arranged most closely to the source line, are orderly connected to the word lines WL0 to WLn−1 respectively. Therefore, the drain of the memory cell transistor MT connected to the word line WLn−1 is connected to the source of the selecting transistor ST1, while the source of the memory cell transistor MT connected to the word line WL0 is connected to the drain of the selecting transistor ST2.

The word lines WL0 to WLn−1 connect the control gate electrodes of the memory cell transistors MT in common among the NAND strings in each block BLK. Namely, the control gate electrodes of the memory cell transistors MT on the same row in the block are connected to the same word line WL.

The bit lines BL0 to BLm−1 connect the drains of the selecting transistors ST1 in common among the blocks BLK. Namely, the NAND strings in the blocks BLK0 to BLKj−1 on the same column are connected to the same bit line BL. The respective bit lines BL are connected to the sense amplifiers SA included in the column control circuit 11.

Data is written or read independently of the even-numbered bit lines or odd-numbered bit lines. Among the m memory cells connected to one word line WL, data is simultaneously written or read in or from (m/2) memory cells connected to the even-numbered bit lines. 1-bit data stored in the (m/2) memory cells out of all the memory cells constitute a unit called a page. The page is a minimum unit of writing or reading. In a case where one memory cell stores 2-bit data, the (m/2) memory cells store data constituting two pages. Likewise, data in the (m/2) memory cells connected to the odd-numbered bit lines constitute another page. Data is simultaneously written or read in or from the memory cells that form one page.

Figure 4:
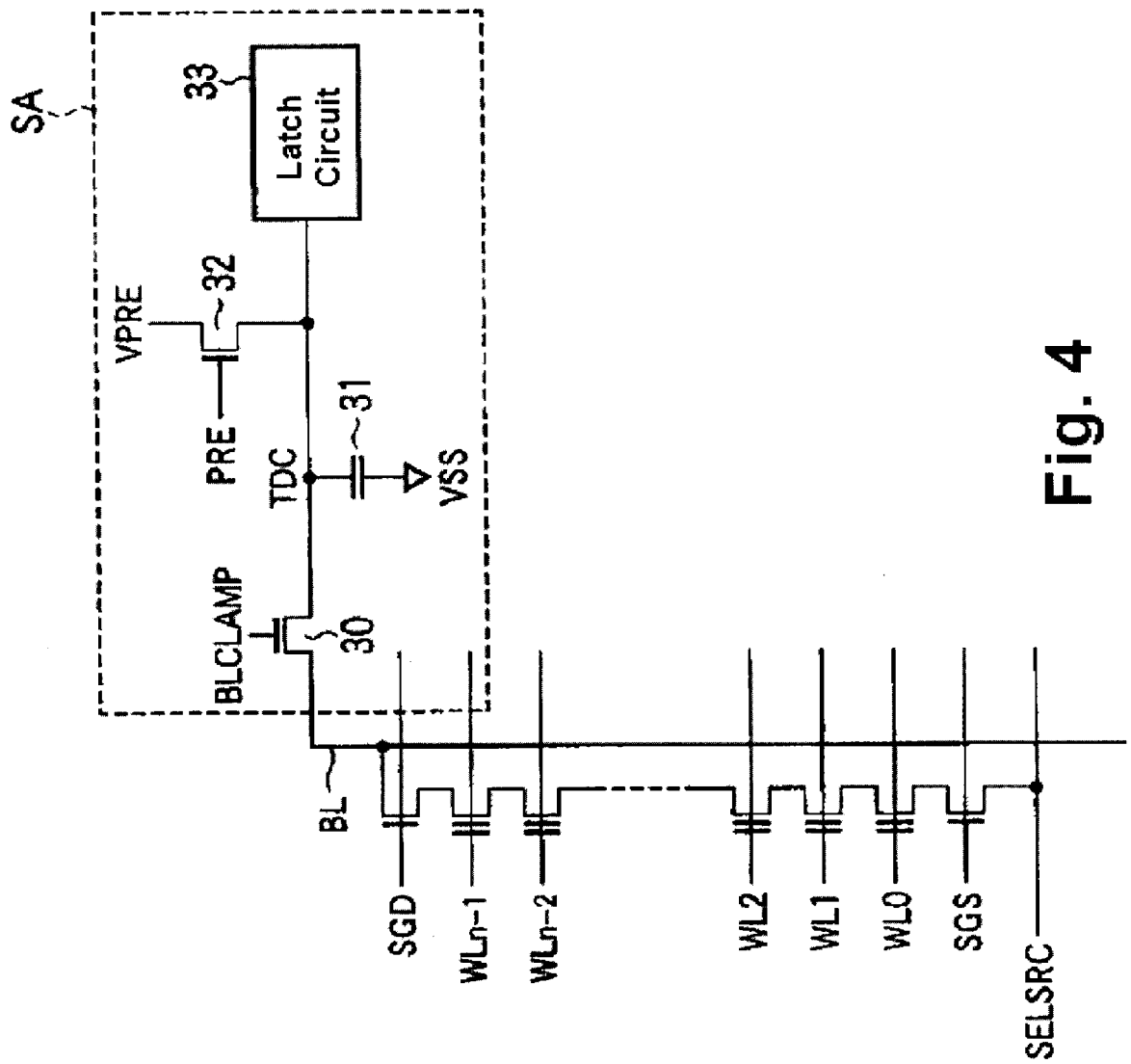
FIG. 4 is a circuit diagram showing the configuration of a sense amplifier SA.

FIG. 4 is a circuit diagram showing the configuration of the sense amplifier SA. FIG. 4 shows the configuration of the sense amplifier SA connected to one bit line. Actually, the same number of circuits, each of which has the configuration shown in FIG. 4, as the number of bit lines is prepared. The sense amplifier SA includes a charge transfer transistor 30, a capacitor 31, an n-channel MOSFET 32, and a latch circuit 33.

The charge transfer transistor 30 is formed with, for example, an n-channel MOSFET. One end of a current path in the charge transfer transistor 30 is connected to the bit line BL. The other end of the current path in the charge transfer transistor 30 is connected to a sense node TDC. A bit-line clamping voltage BLCAMP is applied to the gate of the charge transfer transistor 30. The charge transfer transistor 30 clamps the voltage of the bit line according to the clamping voltage BLCLAMP.

One of the electrodes of the capacitor 31 is connected to the sense node TDC, while the other electrode thereof is grounded. A pre-charging voltage VPRE is applied to one end of a current path in the MOSFET 32. The other end of the current path in the MOSFET 32 is connected to the sense node TDC. A pre-charging signal PRE is fed to the gate of the MOSFET 32. When the pre-charging signal PRE takes on a high level, the MOSFET 32 brings the sense node TDC to the level of a power supply voltage VDD (for example, 2 V) or of a ground voltage VSS (0 V).

The latch circuit 33 stores as data the voltage at the sense node TDC. The data stored in the latch circuit 33 is fed to the data input/output buffer 15. The latch circuit 33 stores data fed from the data input/output buffer 15, and transfers the stored data to the sense node TDC.

(Operations)

Figure 5:
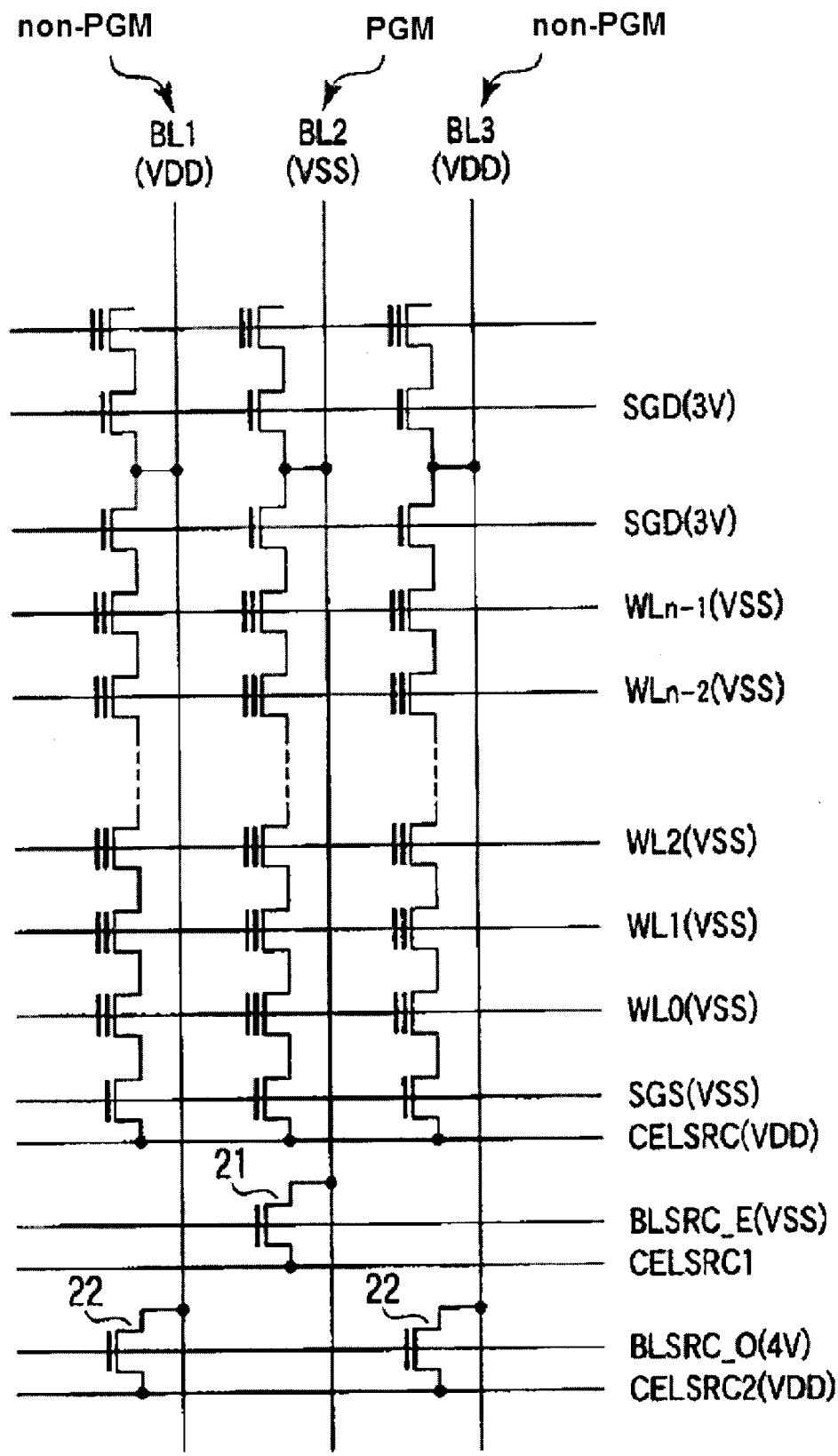
FIG. 5 is a diagram for explaining the relationship among voltages upon data writing.

The operations of the NAND type flash memory 1 having the foregoing configuration will be described below. A case where, for example, memory cells connected to one word line WL are written mutually independently to a side connected to even-numbered bit lines and a side connected to odd-numbered bit lines will be discussed below. FIG. 5 is a diagram for explaining the relationship among voltages upon data writing. The even-numbered bit lines are written, while the odd-numbered bit lines are left unwritten.

On the side of the (selected) even-numbered bit lines to be written, data to be written in the memory cells are held in the sense amplifiers SA, and transferred to the even-numbered bit lines. Therefore, the bit-line voltage control circuit 20 does not charge the even-numbered bit lines. Namely, the selecting line BLSRC_E is set to a low level (ground voltage VSS), and all the NMOSFETs 21 connected to the even-numbered bit lines are therefore turned off. According to the writing data, the even-numbered bit lines are set to the level of the power supply voltage VDD or ground voltage VSS by the sense amplifiers SA.

In contrast, the (unselected) odd-numbered bit lines that are left unwritten are charged by the bit-line voltage control circuit 20. Namely, the selecting line BLSRC_O is set to a high level (for example, about 4 V), and all the NMOSFETs 22 are turned on. The odd-numbered bit lines are charged to have the power supply voltage VDD via the NMOSFETs 22. At this time, since the sources of the NMOSFETs 22 are connected to the source line CELSRC 2, the source line CELSRC2 is set to the level of the power supply voltage VDD. Thus, the odd-numbered bit lines are charged to have the power supply voltage VDD via the source line CELSRC2.

The sense amplifiers SA connected to the odd-numbered bit lines that are unselected may be controlled to charge the odd-numbered bit lines until the voltage of the odd-numbered bit lines becomes equal to the power supply voltage VDD, or may be electrically uncoupled from the odd-numbered bit lines. When the sense amplifiers SA are electrically uncoupled from the bit lines, the sense amplifiers SA need not charge the bit lines but can prepare for the next operation or can be engaged in another operation.

At this time, all the word lines in the block BLK are set to the level of the ground voltage VSS, the selecting gate line SGD is set to a high level (for example, about 3 V), the selecting gate line SGS is set to the level of the ground voltage VSS, and the source line CELSRC is set to the level of the power supply voltage VDD.

Figure 6:
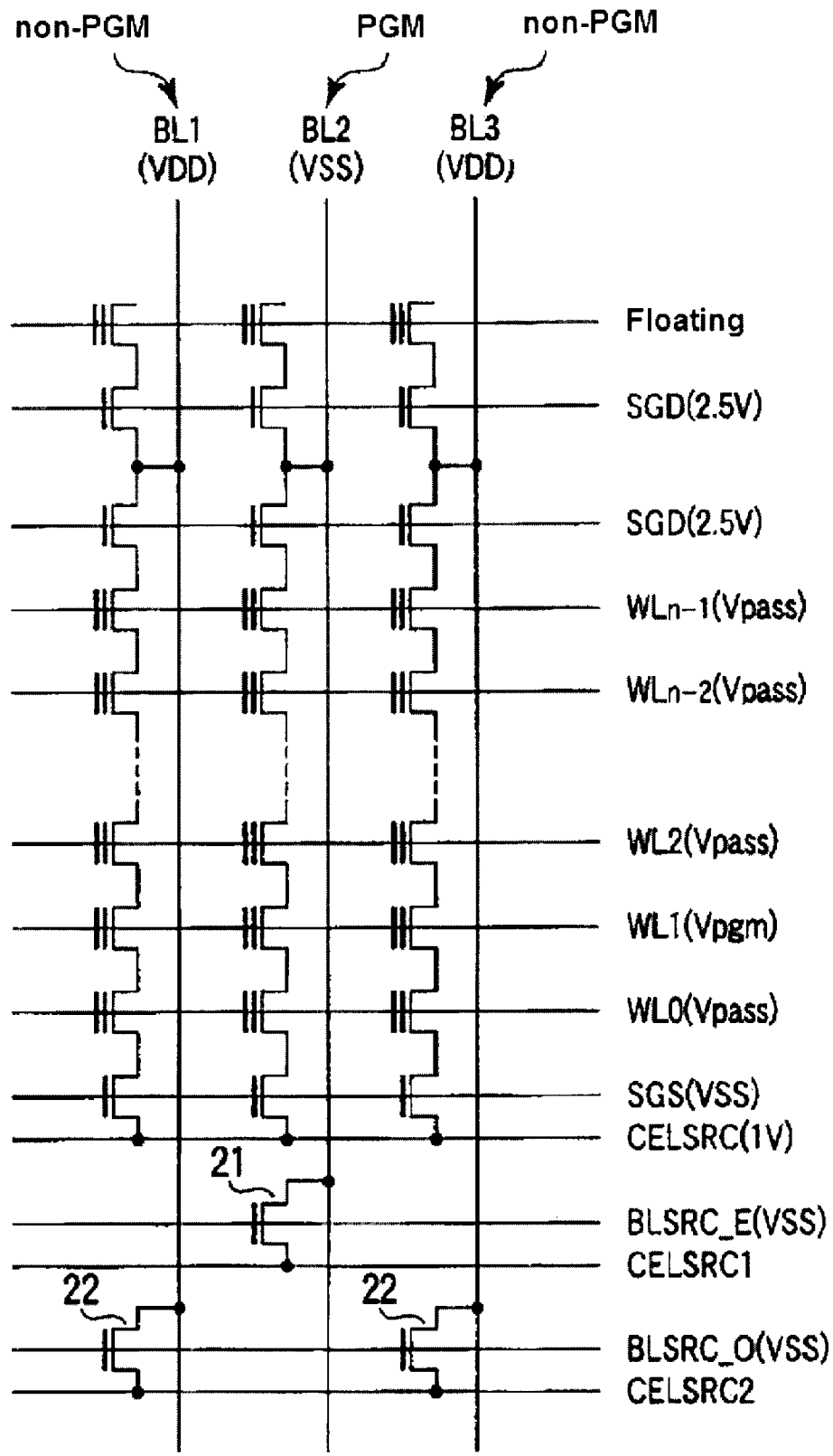
FIG. 6 is a diagram for explaining the relationship among voltages upon data writing.

Thereafter, as shown in FIG. 6, a writing voltage Vpgm (for example, about 20 V) is applied to a word line to be written (for example, the word line WL1), and an intermediate voltage Vpass (for example, about 10 V) is applied to word lines to be left unwritten. The selecting gate line SGD is set to a high level (for example, about 2.5 V), the selecting gate line SGS is set to the level of the ground voltage VSS, and the source line CELSRC is set to a level of, for example, about 1 V. Both the selecting lines BLSRC_E and BLSRC_O are set to the level of the ground voltage VSS, and the NMOSFETs 21 and 22 are turned off. Accordingly, data is written in the memory cells connected to the even-numbered bit lines. When the odd-numbered bit lines are selected bit lines and the even-numbered bit lines are unselected bit lines, the reverse of the foregoing operation is carried out.

Figure 7:
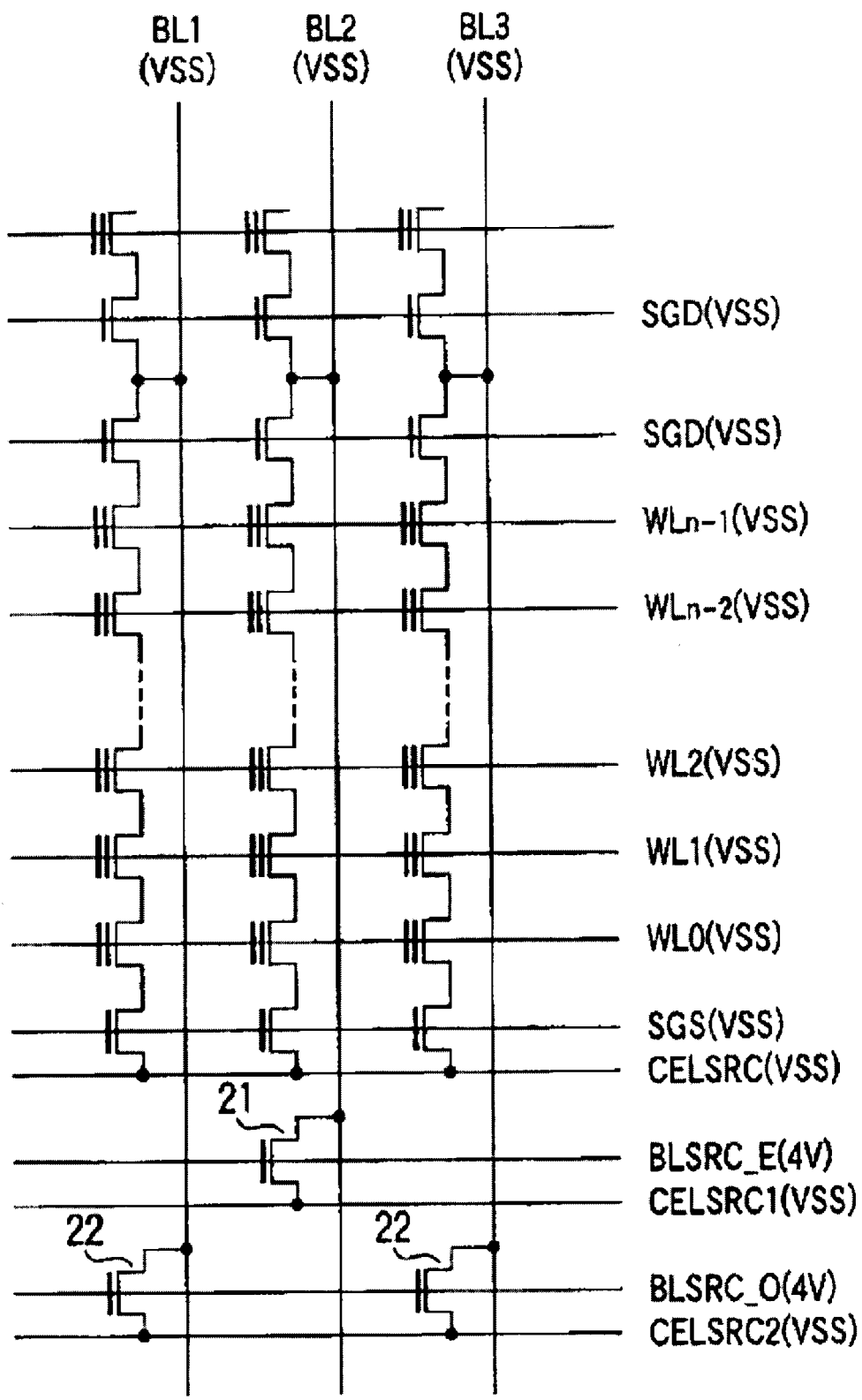
FIG. 7 is a diagram for explaining the relationship among voltages upon bit-line discharging.

Next, a bit-line discharging will be described below. After data is written or after data is read, all the bit lines are discharged. In this embodiment, the discharging can be performed by the bit-line voltage control circuit 20. FIG. 7 is a diagram for explaining the relationship among voltages upon bit-line discharging.

For discharging the bit lines, both the selecting lines BLSRC_E and BLSRC_O are set to a high level (for example, 4 V), and the all NMOSFETs 21 and 22 are turned on. Both the source lines CELSRC1 and CELSRC2 are set to the level of the ground voltage VSS. Accordingly, all the bit lines are discharged by the bit-line voltage control circuit 20. At this time, the sense amplifiers SA do not perform the bid-line discharging.

Figure 8:
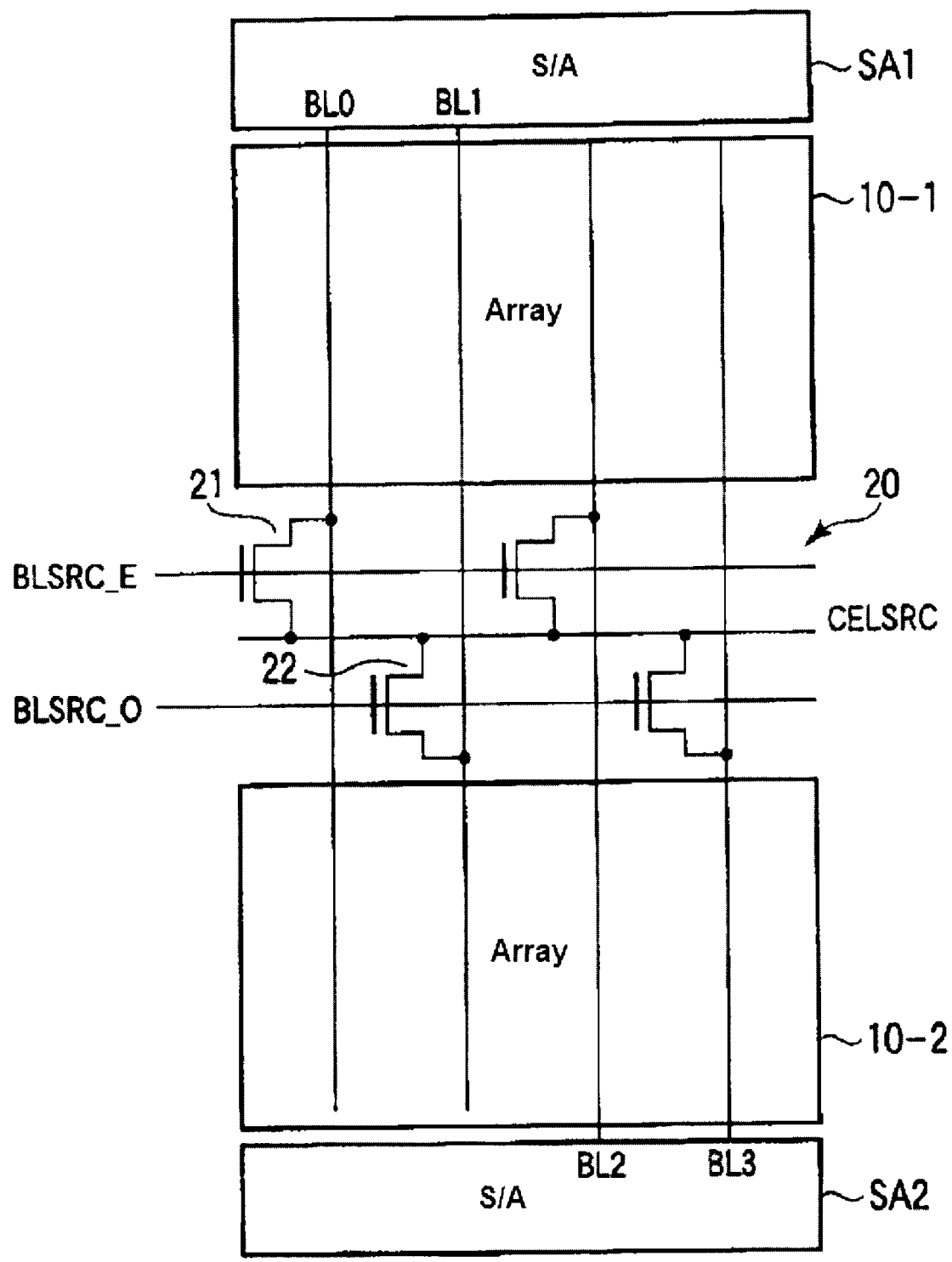
FIG. 8 is a circuit diagram showing another configuration of the bit-line voltage control circuit 20.

The source lines CELSRC1 and CELSRC2 may be integrated into a source line CELSRC connected to NAND strings. FIG. 8 is a circuit diagram showing another construction of the bit-line voltage control circuit 20. The bit-line voltage control circuit 20 includes one source line CELSRC. The source line CELSRC is used in common as the source line CELSRC connected to memory cells. The sources of the NMOSFETs 21 and 22 are connected in common to the source line CELSRC.

In this configuration, since the NMOSFETs 21 and 22 use the source line CELSRC to charge or discharge bit lines, formation of power-supply wiring for the power supply voltage VDD and ground voltage VSS in the region of the bit-line voltage control circuit 20 can be omitted. The source line CELSRC is formed as upper-layer wiring disposed above a substrate. For charging the bit lines, sufficiently thick power-supply wiring is necessary. The upper-layer wiring causes a satisfactorily low resistance, and makes it easy to connect the source line CELSRC to the NMOSFETs 21 and 22. Therefore, the source line CELSRC can be connected to the NMOSFETs 21 and 22 with the low resistance.

(Advantage)

As mentioned above, in the first embodiment, the bit-line voltage control circuit 20 that is connected to all the bit lines and charges or discharges all the bit lines is disposed, for example, in the center in a bit-line direction of the memory cell array 10, that is, in the center of the bit lines in such a manner of bisecting the memory cell array 10. The bit-line voltage control circuit 20 includes the NMOSFETs 21 connected between the even-numbered bit lines and the source line CELSRC1 and the NMOSFETs 22 connected between the odd-numbered bit lines and the source line CELSRC2. According to various operations, the even-numbered bit lines are charged or discharged via the NMOSFETs 21, and the odd-numbered bit lines are charged or discharged via the NMOSFETs 22.

Therefore, according to the first embodiment, when writing is performed mutually independently to the side of the even-numbered bit lines and the side of odd-numbered bit lines, since the unselected bit lines can be charged by the bit-line voltage control circuit 20, it is possible to speed up charging the unselected bit lines. Specifically, when the bit lines are charged by the bit-line voltage control circuit 20 disposed in the center of the bit lines, a time constant of the bit lines becomes about a ¼ of that attained when the bit lines are charged at one ends of the bit lines. In addition, since the unselected bit lines are charged at a high speed, it is possible to charge the adjacent selected bit lines that undergo capacitive coupling at the high speed. Therefore, it is possible to speed up charging the bit lines to speeded up the operation of the NAND type flash memory 1.

When the effect of capacitive coupling is intense, the bit-line charging speed largely depends on a change in the voltage of an adjacent bit line. Therefore, if the unselected bit lines can be quickly brought to an intended voltage level, it is possible to shorten the time taking to discharge the selected bit lines by releasing a voltage, which is floated due to the capacitive coupling, until the selected bit lines have the ground voltage VSS after the discharging of the selected bit lines is begun.

After data is written or after data is read, all the bit lines are discharged. Even in this case, similarly to charging, since the time constant of the bit lines becomes a ¼, it is possible to speed up discharging the bit lines. Conventionally, the sense amplifiers SA are used to discharge the bit lines. In this embodiment, the bit lines are discharged by the bit-line voltage control circuit 20. Since the sense amplifiers SA are not used for discharging, the sense amplifiers SA can prepare for a subsequent operation or can be engaged in another operation. As a result, it is possible to speed up the operations of the NAND type flash memory 1.

In the above description, an example of the configuration in which one sense amplifier SA is connected to each bit line BL is presented. Alternatively, one sense amplifier SA may be associated with two bit lines. In this case, one sense amplifier SA is disposed in association with a pair of adjoining even-numbered and odd-numbered bit lines. The bit lines connected to the sense amplifier SA are switched using a switching element.

(Second Embodiment)

In the first embodiment, the memory cell array 10 is divided in to two portions, and the NMOSFETs 21 and 22 with high-voltage resistance are disposed between the two portions. The reason why the MOSFETs with high-voltage resistance are used as the NMOSFETs 21 and 22 lies in that: the voltage of the bit lines EL and source line CELSRC becomes high as about 20 V upon data deletion; and the high voltage is applied to the NMOSFETs 21 and 22. In contrast, when the memory cell array 10 is divided into portions, it is necessary to prepare an extra region such as a well separation region. This invites an increase in a chip size. On the contrary, a second embodiment discloses a technology for realizing the same advantage as the first embodiment does while suppressing the increase in the chip size.

Figure 9:
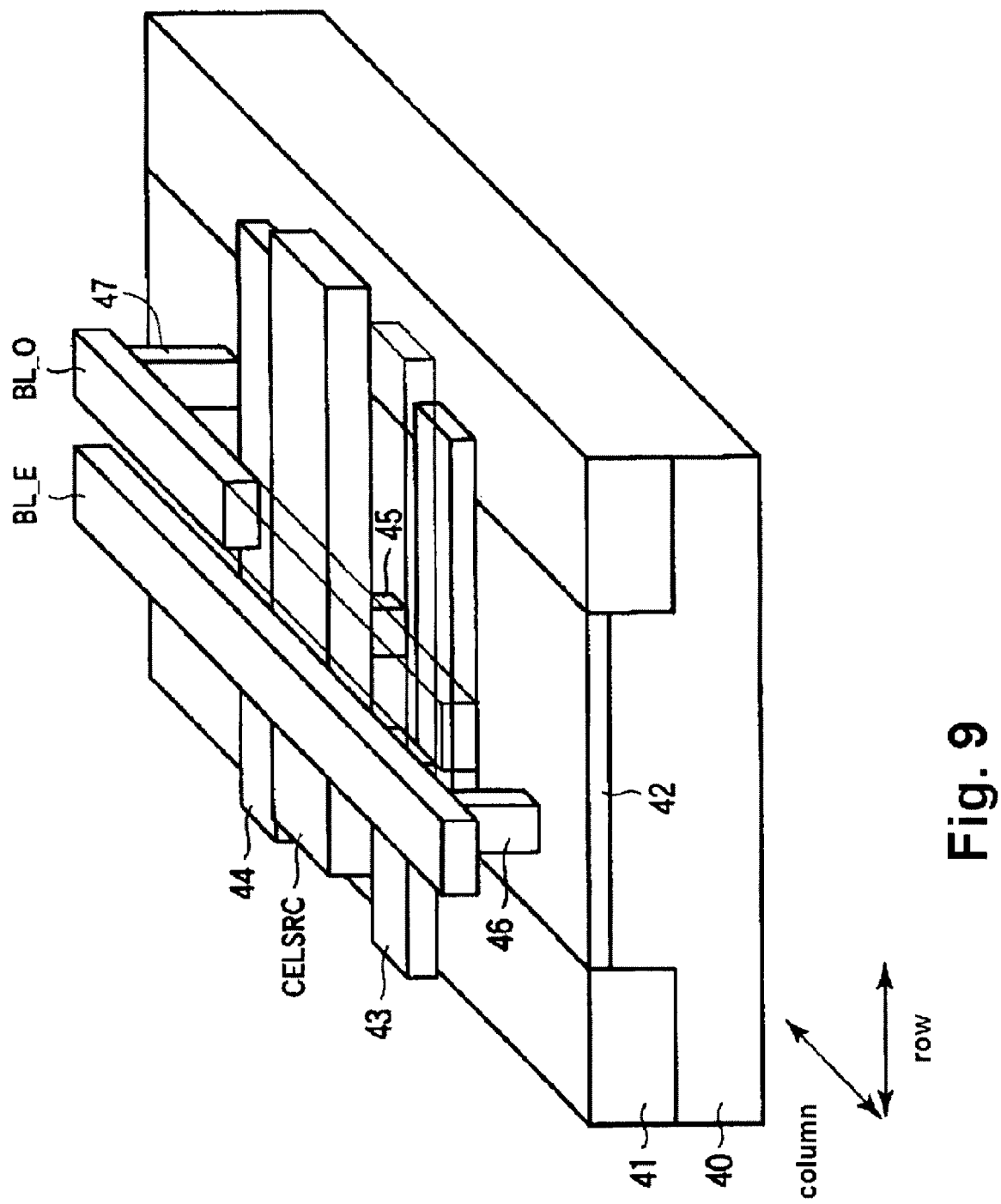
FIG. 9 is a perspective diagram showing the configuration of NMOSFETs 21 and 22 included in the bit-line voltage control circuit 20.
Figure 10:
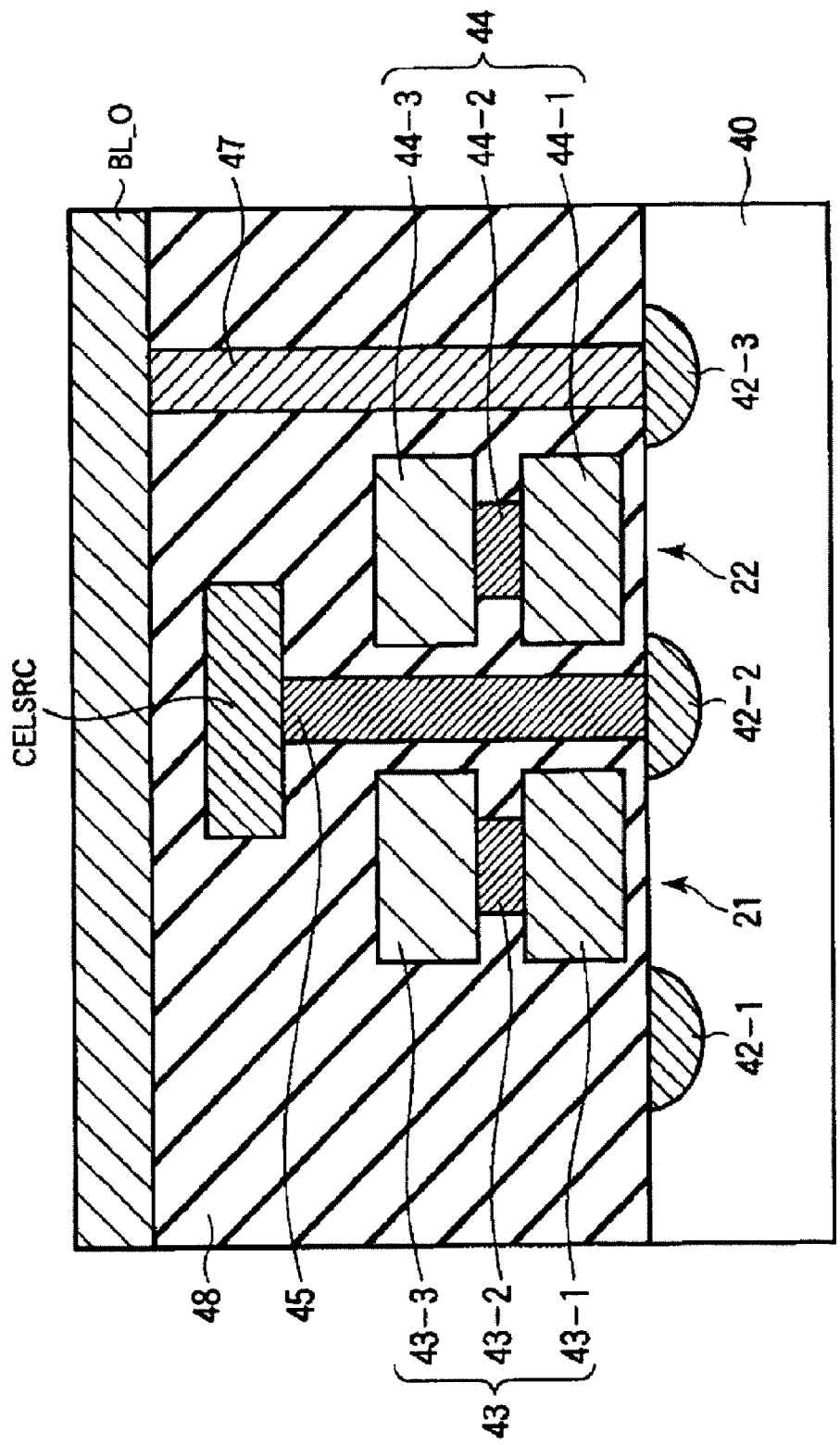
FIG. 10 is a sectional view of the NMOSFETs 21 and 22 cut along an even-numbered bit line BL_O.

FIG. 9 is a perspective view showing the configuration of the NMOSFETs 21 and 22 included in the bit-line voltage control circuit 20. FIG. 10 is a sectional view of the NMOSFETs 21 and 22 cut along an even-numbered bit line BL_O.

In a p-type well 40 in which a memory cell is formed, an element separation insulating layer 41 is formed. The element separation insulating layer 41 is formed through, for example, shallow trench isolation (STI). An area in the superficial area of the p-type well 40 in which the element separation insulating layer 41 is not formed is an active area in which an element is formed.

In the p-type well 40, the NMOSFET 21 is formed. Specifically, a drain region 42-1 and a source region 42-2 that are separated from each other are included in the p-type well 40. The drain region 42-1 and source region 42-2 are constituted by $n^+$-type diffuse regions produced by doping a high-concentration $n^+$-type impurity into the p-type well 40. A gate electrode 43 is formed between the drain region 42-1 and source region 42-2 and on the p-type well 40 via a gate insulating film. The gate electrode 43 includes a first electrode 43-1 made of the same material as the floating gate electrode of a memory cell, a second electrode 43-3 made of the same material as the control gate electrode of the memory cell, and a contact 43-2 that allows the first electrode 43-1 and second electrode 43-3.

Similarly, the NMOSFET 22 is formed in the p-type well 40. Specifically, a drain region 42-3 and the source region 42-2 that are separated from each other are formed in the p-type well 40. The drain region 42-3 and source region 42-2 are constituted by $n^+$-type diffuse regions produced by doping a high-concentration $n^+$-type impurity into the p-type well 40. The source region 42-2 is shared by the NMOSFET 21 and NMOSFET 22. A gate electrode 44 is formed between the drain region 42-3 and source region 42-2 and on the p-type well 40 via the gate insulating film. The gate electrode 44 includes a first electrode 44-1 made of the same material as the floating gate electrode of the memory cell is, a second electrode 44-3 made of the same material as the control gate electrode of the memory cell is, and a contact 44-2 that allows the first electrode 44-1 and second electrode 44-3 to conduct.

A contact plug 45 is formed on the source region 42-2. A source line CELSRC extending in a row direction is formed on the contact plug 45. FIGS. 9 and 10 show the construction in which the NMOSFET 21 and NMOSFET 22 share the same source line CELSRC.

A contact plug 46 is formed on the drain region 42-1. An even-numbered bit line BL_E extending in a column direction is formed on the contact plug 46. A contact plug 47 is formed on the drain region 42-3. An odd-numbered bit line BL_O extending in the column direction is formed on the contact plug 47. The region between the p-type well 40 and bit lines BL is filled with an interlayer insulating layer 48.

The NMOSFETs 21 and 22 have the same structure as the selecting transistors ST1 and ST2 included in each NAND string do. In this example, the width of the active area of the NMOSFETs 21 and 22 is identical to the width of the active area of memory cells, and the gate width of the NMOSFETS 21 and 22 is identical to the gate width of the selecting transistors ST1 and ST2.

Upon data deletion, the voltage of the p-type well 40, source line CELSRC, and bit lines BL is about 20 V. Since the NMOSFETs 21 and 22 are arranged in the memory cell array 10, when the gate electrodes 43 and 44 of the NMOSFETs 21 and 22 are floated, the voltage of the gate electrodes 43 and 44 becomes about 20 V due to capacitive coupling upon data deletion. However, since the NMOSFETs 21 and 22 have the same configuration as the selecting transistors ST1 and ST2. Namely, since the NMOSFETs 21 and 22 are constituted by MOSFETs with high-voltage resistance, there arises no problem related to voltage resistance even upon data deletion.

In this embodiment, two rows of NMOSFETs should merely be disposed in the center of the memory cell array 10. The width of the active area including the two rows of NMOSFETs is identical to the width of the active area including memory cells. Therefore, an increase in an area due to further including the bit-line voltage control circuit 20 can be largely reduced.

The width of the active area is not limited to the width identical to that of the memory cells. For example, when NMOSFETs whose cell pitch is twice larger are employed, it is necessary to juxtapose the NMOSFETs in four rows. When NMOSFETs whose cell pitch is n times larger are employed, it is necessary to juxtapose the NMOSFETs in the number of rows equivalent to the n-th power of 2. The wider the cell pitch is, the larger an area occupied by the NMOSFETs in the bit-line voltage control circuit 20 is. However, when the bit-line voltage control circuit 20 having the configuration shown in FIGS. 9 and 10 is disposed in the memory cell array 10, it is possible to omit a well separation region. This would prove effective in reducing a chip area.

The invention is not limited to the foregoing embodiments, but can be embodied by modifying components without a departure from the gist. Further, the embodiments include inventions on various stages. Various inventions can be formed by appropriately combining plural components disclosed on one of the embodiments or by appropriately combining components disclosed in the different embodiments. For example, even when several components are excluded from all the components disclosed in the embodiment, as long as the problem to be solved by the invention can be solved and the advantage of the invention can be obtained, the embodiment having the excluded components can be provided as the invention.

What is claimed is:

1. A nonvolatile semiconductor memory device comprising:
   a plurality of bit lines extending in a first direction;
   a memory cell array that includes a plurality of blocks each having a plurality of NAND strings each of which includes a group of memory cells connected in series with one another, and first and second selecting transistors connected to the respective edges of the memory cell group, one ends of current paths in the first selecting transistors being connected to the bit lines and one ends of current paths in the second selecting transistors being connected to a source line; and
   a voltage control circuit that is disposed in the memory cell array in a manner of bisecting the memory cell array, and that charges or discharges the bit lines.

2. The nonvolatile semiconductor memory device according to claim 1, wherein
   the voltage control circuit includes:
   a plurality of first MOSFETs of which drains are connected to a plurality of even-numbered bit lines, sources are connected in common to a first source line, and gates are connected in common to a first selecting line; and
   a plurality of second MOSFETs of which drains are connected to a plurality of odd-numbered bit lines, sources are connected in common to a second source line, and gates are connected in common to a second selecting line.

3. The nonvolatile semiconductor memory device according to claim 2, wherein
   when the even-numbered bit lines are charged, the first MOSFETs are turned on using the first selecting line, and the first source line is set to a first voltage level; and
   when the odd-numbered bit lines are charged, the second MOSFETs are turned on using the second selecting line, and the second source line is set to the first voltage level.

4. The nonvolatile semiconductor memory device according to claim 2, wherein
   when the even-numbered bit lines are discharged, the first MOSFETs are turned on using the first selecting line, and the first source line is set to a second voltage level; and
   when the odd-numbered bit lines are discharged, the second MOSFETs are turned on using the second selecting line, and the second source line is set to the second voltage level.

5. The nonvolatile semiconductor memory device according to claim 2, wherein
   the first source line is used in common as the second source line.

6. The nonvolatile semiconductor memory device according to claim 2, wherein
   the first and second MOSFETs have the same configuration as the selecting transistors.

7. The nonvolatile semiconductor memory device according to claim 3, wherein
   when the even-numbered bit lines are discharged, the first MOSFETs are turned on using the first selecting line, and the first source line is set to a second voltage level; and
   when the odd-numbered bit lines are discharged, the second MOSFETs are turned on using the second selecting line, and the second source line is set to the second voltage level.

8. The nonvolatile semiconductor memory device according to claim 7, wherein
   the first source line is used in common as the second source line.

9. The nonvolatile semiconductor memory device according to claim 8, wherein
   the first and second MOSFETs have the same configuration as the selecting transistors.

10. The nonvolatile semiconductor memory device according to claim 4, wherein
the first source line is used in common as the second source line.

11. The nonvolatile semiconductor memory device according to claim 10, wherein
the first and second MOSFETs have the same configuration as the selecting transistors.

12. The nonvolatile semiconductor memory device according to claim 5, wherein
the first and second MOSFETs have the same configuration as the selecting transistors.

* * * * *